(12) United States Patent
Rao et al.

(10) Patent No.: US 9,146,463 B2
(45) Date of Patent: Sep. 29, 2015

(54) PHOTO-PATTERNABLE MULTIFUNCTIONAL POLYMER NANOCOMPOSITE

(75) Inventors: Ramgopal Rao, Maharashtra (IN); Prashanthi Kovur, Maharashtra (IN)

(73) Assignee: Indian Institute of Technology Bombay (IN)

( * ) Notice: Subject to any disclaimer, the term of this patent is extended or adjusted under 35 U.S.C. 154(b) by 0 days.

(21) Appl. No.: 13/992,133

(22) PCT Filed: Dec. 7, 2011

(86) PCT No.: PCT/IN2011/000839
§ 371 (c)(1),
(2), (4) Date: Jun. 6, 2013

(87) PCT Pub. No.: WO2012/077137
PCT Pub. Date: Jun. 14, 2012

(65) Prior Publication Data
US 2013/0251965 A1    Sep. 26, 2013

(30) Foreign Application Priority Data
Dec. 10, 2010 (IN) .................. 3373/MUM/2010

(51) Int. Cl.
*G03F 7/20* (2006.01)
*G03F 7/004* (2006.01)
*G03F 7/038* (2006.01)

(52) U.S. Cl.
CPC .............. *G03F 7/004* (2013.01); *G03F 7/0047* (2013.01); *G03F 7/0385* (2013.01); *G03F 7/20* (2013.01); *Y10T 428/24893* (2015.01)

(58) Field of Classification Search
CPC ........ G03F 7/0385; G03F 7/0047; G03F 7/20
USPC ................................ 430/325, 280.1; 428/206
See application file for complete search history.

(56) References Cited

U.S. PATENT DOCUMENTS

| | | | |
|---|---|---|---|
| 2006/0257785 A1* | 11/2006 | Johnson ..................... | 430/270.1 |
| 2008/0166670 A1* | 7/2008 | Park et al. .................... | 430/346 |
| 2008/0248596 A1 | 10/2008 | Das et al. | |
| 2009/0159891 A1* | 6/2009 | Daniel et al. .................... | 257/66 |
| 2009/0214848 A1 | 8/2009 | Sands et al. | |

OTHER PUBLICATIONS

International Search Report and Written Opinion issued in application No. PCT/IN2011/000839 on May 16, 2012.
Chang et al., "Exploration of artificial multiferroic thing-film heterostructures using composition spreads" Applied Physics Letters, 84(16):3091-3093 (Apr. 19, 2004).

* cited by examiner

*Primary Examiner* — Brittany Raymond
(74) *Attorney, Agent, or Firm* — Knobbe Martens Olson & Bear LLP

(57) ABSTRACT

The invention provides a photo-patternable multifunctional polymer nanocomposite. The nanocomposite comprises a solvent suspension of multiferroic nanostructures uniformly dispersed in SU-8 polymer matrix. The invention also provides a composite comprising a substrate and a photo-patterned multifunctional polymer nanocomposite layer formed on the substrate. The nanocomposite layer comprises a UV-photolithographed SU-8 polymer having a solvent suspension of multiferroic nanostructures uniformly dispersed in the polymer matrix.

19 Claims, 2 Drawing Sheets

PHOTO-PATTERNABLE MULTIFUNCTIONAL POLYMER NANOCOMPOSITE

RELATED APPLICATION INFORMATION

This application is a U.S. National Phase under 35 U.S.C. §371 of PCT International Application PCT/IN2011/000839, filed Dec. 7, 2011, which claims priority under 35 U.S.C. §119 (a)-(d) to Indian Patent Application No. 3373/MUM/2010 filed Dec. 10, 2010.

FIELD OF THE INVENTION

The present invention relates to a photo-patternable multifunctional polymer nanocomposite. More particularly, the invention relates to a process for preparing the photo-patternable multifunctional polymer nanocomposite.

BACKGROUND OF THE INVENTION

Polymer nanocomposites prepared by incorporating inorganic nano-sized structures into organic polymers have high-performance polymer characteristics which are superior to the characteristics of conventional polymer compositions reinforced by micro-sized structures. This is because of the synergy between the properties of the polymer and the properties of the inorganic structures at the nanoscale level. Other features attributable to polymer nanocomposites include improved thermal resistance, moisture resistance, decreased permeability, charge dissipation and chemical resistance. Most polymer's function effectively below room temperature and so polymer nanocomposites comprising such polymers display good magnetic properties below room temperature. For many applications, there is a need for polymer nanocomposites to perform consistently even at temperatures above room temperature. Generally above room temperature, polymer nanocomposites tend to show paramagnetic properties which are undesirable from a device point of view.

SU-8 is a commercially available UV patternable epoxy based negative photoresist polymer that can be patterned into high aspect ratio structures. It has a very low Young's modulus of about 6 GPa as compared to Si based materials which typically have a Young's modulus of over 100 GPa. SU-8 is therefore a good candidate as structural layer in MicroElectro Mechanical Systems (MEMS). While SU-8 is inherently electrically insulating and non-magnetic, its properties can be modified by the introduction of functional nanostructures into the polymer matrix. Polymer nanocomposites comprising SU-8 embedded with magnetic nickel nanoparticles, carbon black nanoparticles, carbon nanotubes, gold nanoparticles or silver nanoparticles are known for lab-on-a-chip applications. However, such polymer nanocomposites are piezoresistive ie they respond to a change in mechanical conditions through a change in electrical resistance. Hence, the applications of such polymer nanocomposites are limited to systems requiring only unidirectional sensitivity such as sensors.

SUMMARY OF THE INVENTION

According to an embodiment of the invention there is provided a photo-patternable multifunctional polymer nanocomposite comprising a solvent suspension of multiferroic nanostructures uniformly dispersed in SU-8 polymer matrix.

According to another embodiment of the invention there is provided a process for preparing a photo-patternable multifunctional polymer nanocomposite comprising forming a suspension of multiferroic nanostructures in a solvent and then dispersing the said suspension in SU-8 polymer matrix.

According to an embodiment of the invention there is also provided a method of making a composite comprising a substrate and a photo-patterned multifunctional polymer nanocomposite layer formed on the substrate, wherein the photo-patterned multifunctional polymer nanocomposite layer is formed by:

a) dispersing a solvent suspension of multiferroic nanostructures in SU-8 polymer matrix;

b) spin-coating the dispersion onto one side of the substrate to form a layer on the substrate;

c) evaporating solvents from the layer by soft-baking the layer;

d) photo-patterning the layer by UV photolithography;

e) developing the layer to yield photo-patterned cross-linked nanocomposite on the substrate; and f) removing weakly bonded multiferroic nanostructures from the layer.

The removal of weakly bonded multiferroic nanostructures in step (f) can be done by rinsing the nanocomposite in a polar solvent According to yet another embodiment of the invention there is provided a composite comprising a substrate and a photo-patterned multifunctional polymer nanocomposite layer formed on the substrate, wherein the nanocomposite layer comprises a UV-photolithographed SU-8 polymer having a solvent suspension of multiferroic nanostructures uniformly dispersed in the polymer matrix.

Preferably, the multiferroic nanostructures are selected from the group comprising nanostructures of barium titanate (BTO), bismuth ferrite (BFO), $RMn_2O_5$ where R represents Y or a rare earth element from Nd to Lu and $XMnO_3$ where X represents Bi, Y, Ho, Lu, Gd, Tb or Dy. Preferably, the multiferroic nanostructures are in the size range of 2 nm to 100 nm. Preferably, the solvent suspension of nanostructures comprises nanostructures suspended in cyclopentanone.

It is to be understood that both the foregoing general description and the following detailed description of the present embodiments of the invention are intended to provide an overview or framework for understanding the nature and character of the invention as it is claimed. The accompanying drawings are included to substantiate the invention and are incorporated into and constitute a part of this specification.

DETAILED DESCRIPTION OF THE PREFERRED EMBODIMENTS

Figure 1:
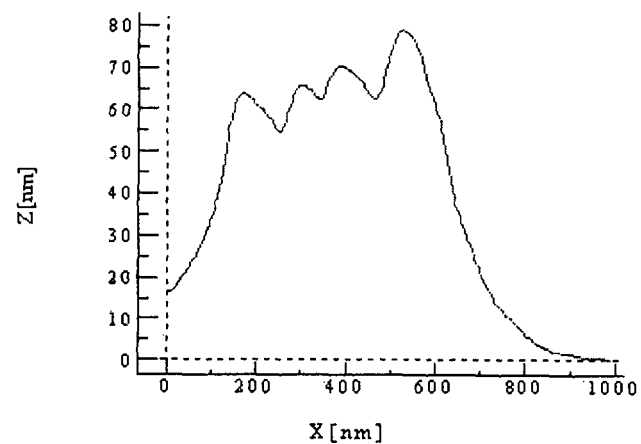
FIG. 1 is an Atomic Force Microscopy (AFM) surface profile of photo-patterned multifunctional polymer nanocomposite prepared according to an embodiment of the invention.

For simplicity and illustrative purposes, the present invention is described by referring mainly to exemplary embodiments thereof. In the following description, numerous specific details are set forth in order to provide a thorough understanding of the present invention. It will be apparent, however, to one of ordinary skill in the art that the present invention may be practiced without limitation to these specific details. In other instances, well known methods and structures have not been described in detail so as not to unnecessarily obscure the present invention.

In the context of the invention, the term "multifunctional" as used in the specification in relation to polymer nanocomposites refers to functionalities such as multiferroicity, ferroelectricity, piezoelectricity, pyroelectricity and/or ferromagnetism.

The piezoelectric effect in the polymer nanocomposite of the invention is achieved either by application of electric field or magnetic field or by thermal treatment.

Multiferroic materials, in which both ferroelectric and magnetic domains can co-exist, have a wide range of applications in sensors, digital memories, spin filters and electrically switchable spin valves. Barium titanate ie $BaTiO_3$ is a multiferroic perovskite ferroelectric oxide with a high-dielectric constant and large piezoelectric coefficient. Barium titanate (BTO) based systems have several applications such as in piezoelectric detectors, thin film capacitors, and magnetoelectric (ME) devices.

Though nanoparticles of BTO are used to prepare the polymer nanocomposite in a preferred embodiment of the present invention, it is well within the scope of the invention to have nanostructures of other multiferroic materials dispersed in the polymer nanocomposite to obtain a photopatternable multifunctional polymer nanocomposite.

The solvent suspension of multiferroic nanostructures can be dispersed in SU-8 polymer matrix by ultrasonication, probe sonication, mixing, or any other dispersing technique.

The nanocomposite is amenable to being coated as a layer on a wide range of substrates while maintaining its multifunctional properties. The nanocomposite can be coated onto a silicon based substrate or a non-silicon substrate, preferably onto a metal coated silicon based substrate. Coating the nanocomposite on chrome-gold can be done for the purpose of better adhesion which aids conductivity. Metal electrodes can contact the nanocomposite layer on both the upper and lower surfaces of the nanocomposite, ie the nanocomposite layer can be sandwiched between the electrodes, or planar metal electrodes can contact the upper surface of the nanocomposite layer while the lower surface is in contact with a support or substrate which can be non-piezoelectric. Such arrangements are compatible with Complementary Metal Oxide Semi-conductor (CMOS) technology and the nanocomposite layer can also be used as a high-k element in transistors as well as a piezoelectric element in MEMS devices.

During UV photolithography, UV exposure through a photomask can be done for 50 to 120 seconds depending upon the weight fraction of the polymer nanocomposite. More exposure time is given for polymer nanocomposites with a higher weight percentage of multiferroic nanostructures.

The invention provides a photo-patternable multifunctional polymer nanocomposite and a process for preparing the same. The multiferroic nanostructures are dispersed in photosensitive optically transparent SU-8 polymer matrix which enables facile photolithography-based microfabrication of the nanocomposite. The uniform dispersion of the nanostructures in the SU-8 polymer matrix is essential for successfully photo-patterning the nanocomposite layer and precludes variability in the electrical properties of the nanocomposite. As the nanocomposite is multifunctional, the piezoelectric behavior can be effected either by application of electric field or magnetic field or both or by thermal treatment. When the multifunctional polymer nanocomposite strains in the presence of the applied electric or magnetic field or upon thermal treatment, a bending moment develops. The induced bending moment produces a deflection of the device in which the multifunctional nanocomposite is incorporated. Such a deflection results in an electrical output. The nanocomposite of the invention is, therefore, ideal for use as a piezoelectric element in MEMS devices. The nanocomposite may be used to measure dynamic changes in mechanical variables, e.g. acceleration, vibration and mechanical shock. As the nanocomposite is multifunctional and not just piezoresistive, it can be used not only in sensors but also in actuators. The multifunctional polymer nanocomposite may be used to sense bio molecules or explosive molecules. Further, the nanocomposite is amenable to being coated on a wide range of substrates while maintaining its multifunctional properties. The nanocomposite can also be used in devices employing Complementary Metal Oxide Semi-conductor (CMOS) technology. Also, the photo-patterned multifunctional polymer nanocomposite prepared according to an embodiment of the invention functions effectively even at room temperature as the SU-8 polymer has a high flashing point and can withstand temperatures up to 120° C. without any appreciable change in electrical or magnetic properties of the nanocomposite.

The following experimental example is illustrative of the invention but not limitative of the scope thereof:

Example 1

Commercially available BTO nanoparticles having an average particle size of 80 nm, tetragonal structure and spherical grain morphology were suspended in 1 ml of cyclopentanone. Subsequently, the suspension was dispersed in 1 ml of SU-8 polymer such that the weight ratio of BTO:SU-8 polymer was 20:80. The dispersion was probe sonicated at 4 W for 20 minutes to obtain a uniform dispersion of the nanocomposite. The dispersion was then spin-coated at 3000 rpm for 20 seconds onto a highly conducting Si substrate and also separately onto a gold coated Si substrate to obtain a 3 μm thick layer of the nanocomposite on the respective substrates. This was followed by a soft bake at 70° C. for 4 minutes and at 90° C. for 7 minutes to evaporate the solvent from the nanocomposite. Patterning the nanocomposite was done using standard UV photolithography. UV exposure through a photomask was done for 120 seconds. This was followed by a hard bake at 70° C. for 4 minutes and at 90° C. for 7 minutes. Then the nanocomposite layer was developed using a standard SU-8 developer. The uncrosslinked SU-8 layer along with the uncrosslinked nanocomposite layer was removed during development, leaving behind the crosslinked nanocomposite patterns. The developing time was 60 seconds. A final rinse in isopropyl alcohol (IPA) was done to remove weakly bonded BTO nanoparticles and other residues, leaving behind the desired nanocomposite patterns on the respective substrates.

FIG. 1 is an AFM surface profile of the polymer nanocomposite prepared according to Example 1. The number of peaks in the profile correspond to the number of nanoparticles in a defined scanning area. The width of the peaks indicate that the width of each of the nanoparticles is about 80 nm. The minor differences in the heights of the peaks correspond to the minor differences in size of the nanoparticles. The non-overlapping nature of the peaks is indicative of the uniform dispersion of the BTO nanoparticles in SU-8 polymer.

Figure 2:
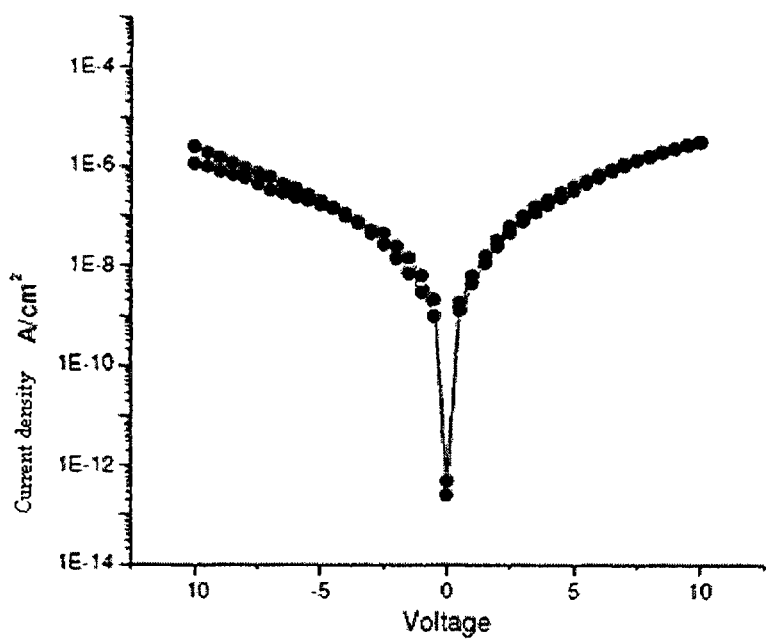
FIG. 2 is a graph of current density v/s voltage showing current leakage of photo-patterned multifunctional polymer nanocomposite prepared according to an embodiment of the invention.

FIG. 2 is a graph of current density v/s voltage showing current leakage of the polymer nanocomposite prepared according to Example 1. The nanocomposite shows low leakage of current up to 10V.

Figure 3:
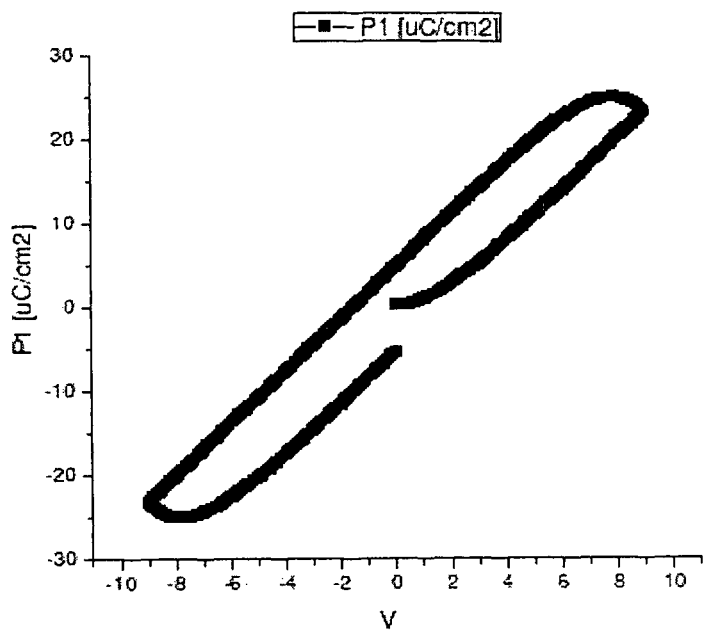
FIG. 3 is a graph showing P-E hysteresis of photo-patterned multifunctional polymer nanocomposite prepared according to an embodiment of the invention.

FIG. 3 is a graph showing P-E hysteresis of the polymer nanocomposite prepared according to Example 1.

Figure 4:
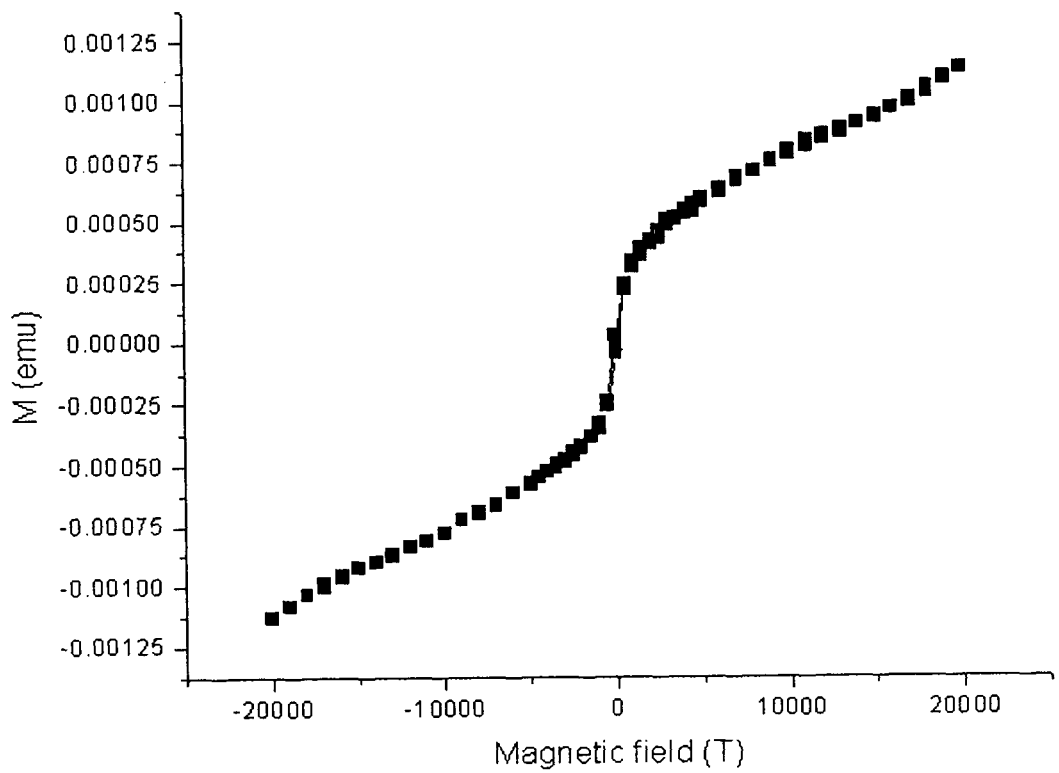
FIG. 4 is a graph showing M-H hysteresis of photo-patterned multifunctional polymer nanocomposite prepared according to an embodiment of the invention.

FIG. 4 is a graph showing M-H hysteresis of the polymer nanocomposite prepared according to Example 1.

From FIG. 1, it is evident that there is uniform dispersion of the BTO nanoparticles in SU-8 polymer. According to FIG. 2, the nanocomposite shows low leakage of current up to 10V. It may be noted that in CMOS technology, one requires that the nanocomposite should show low leakage up to 5V. Thus, the present invention exceeds conventional requirements. From the saturated hysteresis loop in FIG. 3 it is plainly evident that the nanocomposite displays ferroelectricity and therefore piezoelectricity. From the well saturated hysteresis loop in FIG. 4 it is plainly evident that the nanocomposite displays ferromagnetism.

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

The invention claimed is:

1. A photo-patternable multifunctional polymer nanocomposite comprising a solvent suspension of multiferroic nanostructures uniformly dispersed in SU-8 polymer matrix.

2. The photo-patternable multifunctional polymer nanocomposite as claimed in claim 1, wherein the multiferroic nanostructures are selected from the group comprising nanostructures of barium titanate (BTO), bismuth ferrite (BFO), $RMn_2O_5$ where R represents Y or a rare earth element from Nd to Lu and $XMnO_3$ where X represents Bi, Y, Ho, Lu, Gd, Tb or Dy.

3. The photo-patternable multifunctional polymer nanocomposite as claimed in claim, wherein the multiferroic nanostructures are in the size range of 2 nm to 100 nm.

4. The photo-patternable multifunctional polymer nanocomposite as claimed in claim 1, wherein the solvent suspension of nanostructures comprises nanostructures suspended in cyclopentanone.

5. A process for preparing a photo-patternable multifunctional polymer nanocomposite comprising making a suspension of multiferroic nanostructures in a solvent and then dispersing the said suspension in SU-8 polymer matrix.

6. The process as claimed in claim 5, wherein the multiferroic nanostructures are selected from nanostructures of barium titanate (BTO), bismuth ferrite (BFO), $RMn_2O_5$ where R represents Y or a rare earth element from Nd to Lu, and $XMnO_3$ where X represents Bi, Y, Ho, Lu, Gd, Tb or Dy.

7. The process as claimed in claim 5, wherein the nanostructures are in the size range of 2 nm to 100 nm.

8. The process as claimed in claim 5, wherein the thinner is cyclopentanone.

9. A method of making a composite comprising a substrate and a photo-patterned multifunctional polymer nanocomposite layer formed on the substrate, wherein the photo-patterned multifunctional polymer nanocomposite layer is formed by:
   a) dispersing a solvent suspension of multiferroic nanostructures in SU-8 polymer matrix;
   b) spin-coating the dispersion onto one side of the substrate to form a layer on the substrate;
   c) evaporating solvents from the layer by soft-baking the layer;
   d) photo-patterning the layer by UV photolithography;
   e) developing the layer to yield photo-patterned cross-linked nanocomposite on the substrate; and
   f) removing weakly bonded multiferroic nanostructures from the layer.

10. The method as claimed in claim 9, wherein the multiferroic nanostructures are selected from nanostructures of barium titanate (BTO), bismuth ferrite (BFO), $RMn_2O_5$ where R represents Y or a rare earth element from Nd to Lu, and $XMnO_3$ where X represents Bi, Y, Ho, Lu, Gd, Tb or Dy.

11. The method as claimed in claim 9, wherein the multiferroic nanostructures are in the size range of 2 nm to 100 nm.

12. The method as claimed in claim 9, wherein the solvent suspension of nanostructures comprises nanostructures suspended in cyclopentanone.

13. The method as claimed in claim 9, wherein the removal of weakly bonded multiferroic nanostructures in step (f) is done by rinsing the nanocomposite in a polar solvent.

14. A composite comprising a substrate and a photo-patterned multifunctional polymer nanocomposite layer formed on the substrate, wherein the nanocomposite layer comprises a UV-photolithographed SU-8 polymer having a solvent suspension of multiferroic nanostructures uniformly dispersed in the polymer matrix.

15. The composite as claimed in claim 14, wherein the multiferroic nanostructures are selected from nanostructures of barium titanate (BTO), bismuth ferrite (BFO), $RMn_2O_5$ where R represents Y or a rare earth element from Nd to Lu, and $XMnO_3$ where X represents Bi, Y, Ho, Lu, Gd, Tb or Dy.

16. The composite as claimed in claim 14, wherein the multiferroic nanostructures are in the size range of 2 nm to 100 nm.

17. The composite as claimed in claim 14, wherein the solvent suspension of nanostructures comprises nanostructures suspended in cyclopentanone.

18. A MEMS device comprising the composite as claimed in claim 14, wherein the nanocomposite layer acts as a piezoelectric element.

19. A transistor device comprising the composite as claimed in claim 14, wherein the nanocomposite layer acts as a high-k element.

* * * * *